(12) United States Patent
Kim et al.

(10) Patent No.: US 10,170,242 B2
(45) Date of Patent: Jan. 1, 2019

(54) COMPOSITE ELECTRONIC COMPONENT, METHOD OF MANUFACTURING THE SAME, BOARD FOR MOUNTING THEREOF, AND PACKAGING UNIT THEREOF

(71) Applicant: SAMSUNG ELECTRO-MECHANICS CO., LTD., Suwon-si, Gyeonggi-do (KR)

(72) Inventors: Jin Hwan Kim, Suwon-si (KR); Dae Bok Oh, Suwon-si (KR); Jae Young Park, Suwon-si (KR); Ichiro Tanaka, Suwon-si (KR); Chang Ho Lee, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/652,999

(22) Filed: Jul. 18, 2017

(65) Prior Publication Data

US 2017/0316879 A1 Nov. 2, 2017

Related U.S. Application Data

(63) Continuation of application No. 14/521,116, filed on Oct. 22, 2014, now abandoned.

(30) Foreign Application Priority Data

May 26, 2014 (KR) .................. 10-2014-0063094

(51) Int. Cl.
*H01G 2/14* (2006.01)
*H01G 4/012* (2006.01)
(Continued)

(52) U.S. Cl.
CPC .................. *H01G 2/14* (2013.01); *H01G 2/06* (2013.01); *H01G 2/22* (2013.01); *H01G 4/012* (2013.01);
(Continued)

(58) Field of Classification Search
CPC .. H01G 2/14; H01G 2/06; H01G 2/22; H01G 4/40; H01G 4/248; H01G 4/012; H01G 4/30; H01G 4/12; H05K 1/0259
See application file for complete search history.

(56) References Cited

U.S. PATENT DOCUMENTS 8,847,726 B2  9/2014 Ikeda et al.
9,373,954 B2  6/2016 Sumi et al.
(Continued)

FOREIGN PATENT DOCUMENTS

CN  1542873 A  11/2004
CN  101116155 A  1/2008
(Continued)

OTHER PUBLICATIONS

Notice of Office Action issued in corresponding Korean Patent Application No. 10-2014-0063094, dated Feb. 16, 2017 (with English translation).
(Continued)

*Primary Examiner* — David M Sinclair
(74) *Attorney, Agent, or Firm* — McDermott Will & Emery LLP

(57) ABSTRACT

A composite electronic component composed of a composite body including a capacitor and an electrostatic discharge (ESD) protection device coupled to each other. The capacitor includes a ceramic body in which a plurality of dielectric layers and internal electrodes are stacked with a respective dielectric layer therebetween. The ESD protection device includes first and second electrodes disposed on the ceramic
(Continued)

A-A' body, a discharging part disposed between the first and second electrodes, and a protective layer disposed on the first and second electrodes and the discharging part. An input terminal disposed on a first end surface of the composite body and is connected to internal electrodes and the first and second electrodes. A ground terminal formed on a second end surface of the composite body and is connected to internal electrodes and the first and second electrodes.

37 Claims, 12 Drawing Sheets

(51) Int. Cl.
| | |
|---|---|
| *H01G 4/248* | (2006.01) |
| *H01G 4/40* | (2006.01) |
| *H05K 1/18* | (2006.01) |
| *H01G 2/06* | (2006.01) |
| *H01G 2/22* | (2006.01) |
| *H01G 4/12* | (2006.01) |
| *H01G 4/30* | (2006.01) |
| *H05K 1/02* | (2006.01) |
| *H05K 3/34* | (2006.01) |

(52) U.S. Cl.
CPC .............. *H01G 4/248* (2013.01); *H01G 4/40* (2013.01); *H05K 1/181* (2013.01); *H01G 4/12* (2013.01); *H01G 4/30* (2013.01); *H05K 1/0259* (2013.01); *H05K 3/3442* (2013.01); *H05K 2201/10636* (2013.01); *Y02P 70/611* (2015.11)

(56) References Cited

U.S. PATENT DOCUMENTS

| | | | |
|---|---|---|---|
| 2003/0025587 A1 | 2/2003 | Whitney et al. | |
| 2004/0233606 A1 | 11/2004 | Inoue et al. | |
| 2009/0108984 A1 | 4/2009 | Choi et al. | |
| 2010/0134235 A1 | 6/2010 | Yoshioka et al. | |
| 2010/0157505 A1* | 6/2010 | Feichtinger | H01G 4/30 361/301.4 |
| 2011/0038088 A1 | 2/2011 | Noma et al. | |
| 2011/0222197 A1 | 9/2011 | Adachi et al. | |
| 2012/0152604 A1 | 6/2012 | Ahn et al. | |
| 2012/0300355 A1 | 11/2012 | Umeda et al. | |
| 2014/0002952 A1 | 1/2014 | McConnell et al. | |
| 2014/0083755 A1 | 3/2014 | Lee et al. | |
| 2015/0036248 A1 | 2/2015 | Umeda et al. | |
| 2015/0171618 A1 | 6/2015 | Sumi et al. | |
| 2015/0340154 A1* | 11/2015 | Kim | H01G 2/14 174/260 |

FOREIGN PATENT DOCUMENTS

| | | |
|---|---|---|
| JP | S54-142436 U | 10/1979 |
| JP | 57-017128 U | 7/1980 |
| JP | 57-027239 U | 7/1980 |
| JP | 57-039424 U | 8/1980 |
| JP | 56-125826 A | 10/1981 |
| JP | S57-017129 U | 1/1982 |
| JP | 61-009804 U | 1/1986 |
| JP | H02-304910 A | 12/1990 |
| JP | 06-251981 A | 9/1994 |
| JP | 2000-114005 | 4/2000 |
| JP | 2009-117735 A | 5/2009 |
| JP | 2010-015773 A | 1/2010 |
| KR | 10-2010-0043518 A | 4/2010 |
| KR | 10-2012-0132365 A | 12/2012 |
| KR | 10-2014-0041235 A | 4/2014 |
| WO | 2006/074462 A2 | 7/2006 |
| WO | 2014034435 | 3/2014 |

OTHER PUBLICATIONS

U.S. Office Action dated May 12, 2017 issued in U.S. Appl. No. 14/521,115.
Notice of Office Action issued in corresponding Japanese Patent Application No. 2014-213831, dated Jan. 31, 2017 (with English translation).
U.S. Office Action dated Dec. 21, 2016 issued in U.S. Appl. No. 14/521,116.
U.S. Office Action dated Jul. 12, 2016 issued in U.S. Appl. No. 14/521,116.
First Office Action issued in corresponding Chinese Patent Application No. 201410635204.2, dated Jun. 21, 2017; with English translation.
Notice of Office Action in corresponding Japanese Patent Application No. 2014-213831, dated Sep. 26, 2017 (with English Translation).

\* cited by examiner

A-A'

A-A'

COMPOSITE ELECTRONIC COMPONENT, METHOD OF MANUFACTURING THE SAME, BOARD FOR MOUNTING THEREOF, AND PACKAGING UNIT THEREOF

CROSS-REFERENCE TO RELATED APPLICATION

This application is a continuation patent application of U.S. patent application Ser. No. 14/521,116, filed on Oct. 22, 2014 which claims the benefit of Korean Patent Application No. 10-2014-0063094 filed on May 26, 2014, including the specification, drawings and Abstract is incorporated herein by reference in their entireties.

BACKGROUND

This disclosure relates to a composite electronic component including a plurality of passive devices, a method of manufacturing the same, a board for mounting thereof, and a packaging unit thereof.

Recently, in accordance with rapid development of the semiconductor industry, ultra-high integration of integrated circuits (ICs) for miniaturization of and improvements in levels of performance thereof has been attempted, and as such it has been somewhat difficult to address the problem of electrostatic discharge (ESD) in these untra-miniaturized ICs. Therefore, a need to use an electrostatic discharge protection device in power and signal input terminals of such ICs has increased.

In accordance with the gradual increase in the data rates of portable products such as mobile phones, digital cameras, and personal digital assistants (PDA), high speed data lines, universal serial bus (USB) lines, high definition multimedia interface (HDMI) lines, and the like, countermeasures against electrostatic discharge (ESD) have increased in importance.

In addition, products such as vehicles, televisions (TV), and the like, require connectors for interconnecting connection cables between electronic boards. Since such connectors may be easily touched by a worker in a manufacturing process or by a device user, countermeasures against noise and ESD in such connectors are very important in order to improve product reliability.

As a component for preventing ESD, a multilayer ceramic capacitor (MLCC), a transient voltage suppression (TVS) diode, a varistor, an ESD suppressor, or the like, has been used alone or parallel connections of such components have been used.

In this case, an area in which components are disposed in an electronic apparatus is inevitably increased, which may limit the miniaturization of electronic apparatuses.

Further, it is difficult to secure electrical characteristics such as noise filtering characteristics, unique to MLCCs, in components other than MLCCs. Therefore, it is rare to use components other than MLCCs alone, except in the case of ultrahigh frequency communications terminals.

SUMMARY

Described herein are a composite electronic component capable of being mounted in a decreased area, a method of manufacturing the same, a board for mounting thereof, and a packaging unit thereof.

The composite electronic component, in accord with embodiments of this disclosure, comprises a capacitor having a body in which are located internal electrodes separated by dielectric material; an electrostatic discharge (ESD) protection device disposed on the body of the capacitor and having electrodes coupled to the internal electrodes of the capacitor, the ESD having a discharge part and first and second electrodes at opposite portions of the discharge part; and input and ground terminals coupled to the first and second electrodes of the ESD.

In some embodiments, the composite electronic component may more particularly include a composite body including a capacitor and an electrostatic discharge (ESD) protection device coupled to each other, the capacitor including a ceramic body in which a plurality of dielectric layers and internal electrodes disposed to face each other with a respective dielectric layer interposed therebetween are stacked, the ESD protection device including first and second electrodes disposed on the ceramic body, a discharging part disposed between the first and second electrodes, and a protective layer disposed on the first and second electrodes and the discharging part.

The ESD protection device may be disposed on a lower surface of the ceramic body.

In some embodiments, a composite electronic component may include a composite body in which a noise filter unit and an ESD protection device disposed below the noise filter unit are coupled to each other, and an input terminal and a ground terminal are coupled to the composite body. The noise filter unit may filter a noise component of an input signal to the input terminal, and the ESD protection device may bypass any over-voltage above a rated voltage input to the input terminal.

According to some embodiments, a board for mounting of a composite electronic component may include a printed circuit board on which a plurality of electrode pads are disposed, the composite electronic component as described above installed on the printed circuit board, and solder connecting the electrode pads and the composite electronic component to each other.

According to some embodiments, a packaging unit of a composite electronic component may include the composite electronic components as described above disposed so that ESD protection devices thereof are directed toward bottom surfaces of receiving parts, and a packaging sheet having the receiving parts formed therein, the receiving parts receiving the composite electronic components therein.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
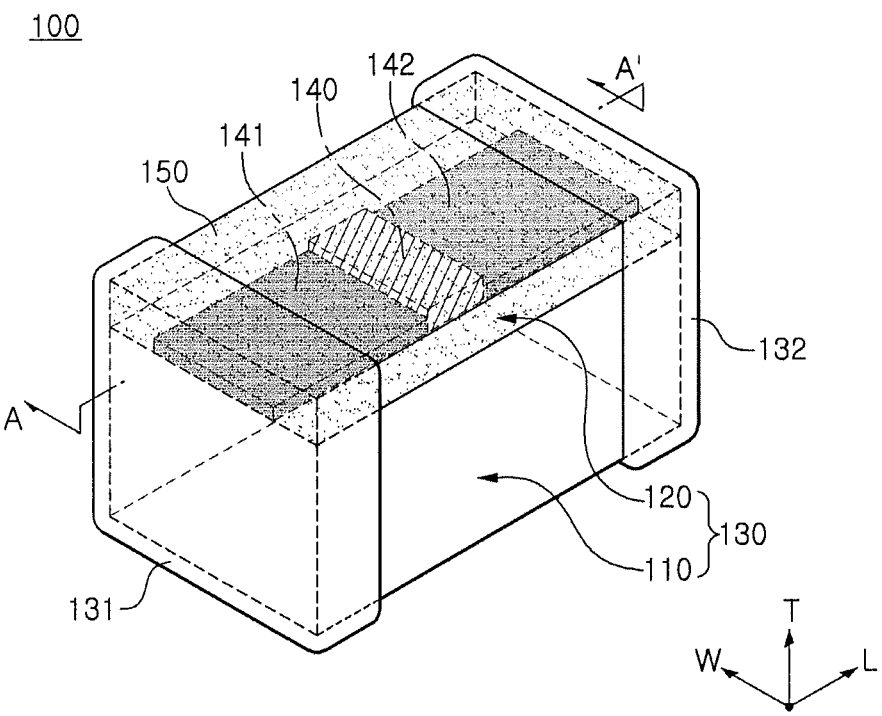
FIG. 1 is a transparent perspective view schematically illustrating a composite electronic component according to a first exemplary embodiment in the present disclosure.

Hereinafter, embodiments of the inventive concepts presented in this disclosure will be set forth in detail with reference to the accompanying drawings. The disclosure may, however, express inventive subject matter embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Composite Electronic Component

Hereinafter, exemplary embodiments in the present disclosure will be set forth in detail with reference to the accompanying drawings.

FIG. 1 is a perspective view schematically illustrating a composite electronic component according to a first exemplary embodiment in the present disclosure.

Figure 2:
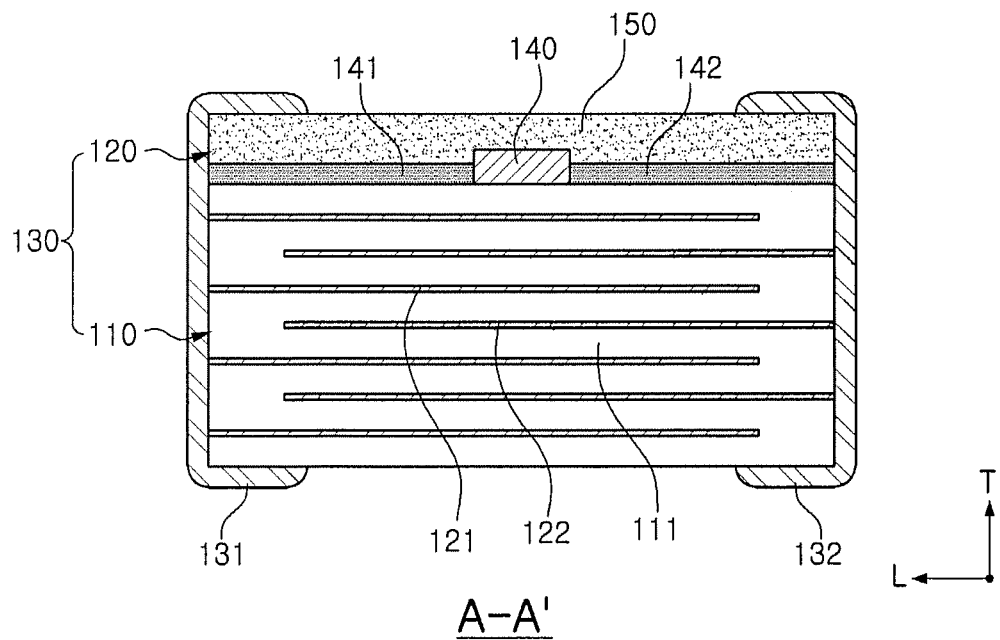
FIG. 2 is a cross-sectional view taken along line A-A' of FIG. 1.

FIG. 2 is a cross-sectional view taken along line A-A' of FIG. 1.

In the composite electronic component according to an exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' refers to a direction in which dielectric layers of a capacitor are stacked, for example, a 'stacking direction'.

Meanwhile, the length direction, the width direction, and the thickness direction of the composite electronic component may be the same as those of a capacitor and an electrostatic discharge (ESD) protection device, as described below.

In addition, in an exemplary embodiment of the present disclosure, the composite electronic component may have upper and lower surfaces opposing each other, and first and second end surfaces connecting the upper and lower surfaces to each other in the length direction and third and fourth side surfaces connecting the upper and lower surfaces to each other in the width direction. The shape of the composite electronic component is not particularly limited, but may be a hexahedral shape as shown in the drawings.

In addition, the first and second end surfaces of the composite electronic component in the length direction and the third and fourth side surfaces thereof in the width direction may be the same as first and second end surfaces of a capacitor and an electrostatic discharge (ESD) protection device in the length direction and third and fourth side surfaces thereof in the width direction, respectively, as described below.

Meanwhile, the composite electronic component may have a form in which the capacitor and the ESD protection device are coupled to each other. In the case in which the ESD protection device is coupled to a lower portion of the capacitor, an upper surface of the composite electronic component refers to an upper surface of the capacitor, and a lower surface of the composite electronic component refers to a lower surface of the ESD protection device.

Referring to FIGS. 1 and 2, a composite electronic component 100 according to a first exemplary embodiment of the inventive concepts herein may include a composite body 130 including a capacitor 110 and an electrostatic discharge (ESD) protection device 120 coupled to each other, the capacitor 110 being configured of a ceramic body in which a plurality of dielectric layers 111 and internal electrodes 121 and 122 disposed so as to face each other with a respective dielectric layer 111 interposed therebetween are stacked; and the ESD protection device 120 including first and second electrodes 141 and 142 disposed on the ceramic body, a discharging part 140 disposed between the first and second electrodes 141 and 142, and a protective layer 150 disposed on the first and second electrodes 141 and 142 and the discharging part 140.

In the exemplary embodiment presented in the present disclosure, the composite body 130 may be formed by coupling the capacitor 110 and the ESD protection device 120 to each other. However, a method of forming the composite body 130 is not particularly limited.

For example, the composite body 130 may be formed by coupling the capacitor 110 and the ESD protection device 120, separately manufactured, with a conductive adhesive, a resin, or the like, or may be formed by sequentially disposing the first and second electrodes 141 and 142, the discharging part 140, and the protective layer 150 on the ceramic body configuring the capacitor 110, but is not particularly limited thereto.

According to the first exemplary embodiment in the present disclosure, the composite body 130 may be formed by sequentially disposing the first and second electrodes 141 and 142, the discharging part 140, and the protective layer 150 on the ceramic body configuring the capacitor 110.

Hereinafter, the capacitor 110 and the ESD protection device 120 configuring the composite body 130 will be described in detail.

Referring to FIG. 2, the ceramic body configuring the capacitor 110 may be formed by stacking a plurality of dielectric layers 111, and a plurality of internal electrodes 121 and 122 (first and second internal electrodes) may be disposed in the ceramic body so as to be spaced apart from each other with a respective dielectric layer interposed therebetween.

The plurality of dielectric layers 111 configuring the ceramic body 110 may be in a sintered state, and adjacent dielectric layers may be integrated, such that boundaries therebetween may not be readily apparent.

The dielectric layer 111 may be formed by sintering a ceramic green sheet containing a ceramic powder, an organic solvent, and an organic binder. The ceramic powder, a high k material, may be a barium titanate ($BaTiO_3$)-based material, a strontium titanate ($SrTiO_3$)-based material, or the like, but is not limited thereto.

Meanwhile, according to the first exemplary embodiment in the present disclosure, the internal electrodes may include first internal electrodes 121 exposed to a first end surface of the composite body 130 in the length direction and second internal electrodes 122 exposed to a second end surface thereof in the length direction, but are not limited thereto.

The first and second internal electrodes 121 and 122 may be formed using a conductive paste containing a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layer 111, using a conductive paste by a printing method such as screen printing or gravure printing.

The ceramic green sheets having the internal electrodes printed thereon may be alternately stacked and sintered to form the ceramic body.

The capacitor may serve to filter a low frequency noise component in a signal interface, an integrated circuit (IC) block, or a communications line.

According to the first exemplary embodiment in the present disclosure, the ESD protection device 120 may be formed by sequentially disposing the first and second electrodes 141 and 142, the discharging part 140, and the protective layer 150 on the ceramic body configuring the capacitor 110.

Generally, as a component for preventing ESD, a multilayer ceramic capacitor (MLCC), an ESD suppressor, or the like, has been used alone or in a state in which such components are connected to each other in parallel.

According to the first exemplary embodiment in the present disclosure, the composite electronic component may include the capacitor 110 and the ESD protection device 120 coupled to each other.

The ESD protection device 120 may be an ESD suppressor, but is not limited thereto.

Since the ESD protection device 120 according to an exemplary embodiment in the present disclosure is the ESD suppressor, it may be different in terms of a structure and actions thereof from a varistor, due to the following reason.

According to the first exemplary embodiment in the present disclosure, the first and second electrodes 141 and 142 may be disposed on the same plane so as to face each other.

The varistor, a general electrical overstress (EOS) protection device, may include a zinc oxide as a raw material and have a form in which palladium (Pd) or silver (Ag) electrodes are stacked while facing each other in the stacking direction with the zinc oxide disposed therebetween.

However, according to the first exemplary embodiment in the present disclosure, the first and second electrodes 141 and 142 may be disposed on the same plane so as to face each other.

However, the first and second electrodes 141 and 142 are not limited thereto, but may be disposed so that they partially face each other in a thickness direction of the composite body 130.

The first and second electrodes 141 and 142 may be formed using a conductive paste containing a conductive metal.

The conductive metal may be nickel (Ni), copper (Cu), palladium (Pd), or alloys thereof, but is not limited thereto.

According to the first exemplary embodiment in the present disclosure, the first and second electrodes 141 and 142 may be printed on the ceramic body using a conductive paste by a printing method such as screen printing method or a gravure printing method.

The discharging part 140 may include a conductive polymer, but is not limited thereto.

The conductive polymer may have characteristics of a non-conductor in the case in which a signal voltage input from a signal interface through which signals are transferred from a connector to a system or an integrated circuit (IC), an IC block of a power supply terminal, or a communications line corresponds to a rated voltage (circuit voltage) level, but may have characteristics of a conductor in the case in which an over-voltage such as ESD, or the like, is instantaneously generated.

The first and second electrodes 141 and 142 may be short-circuited due to the discharging part 140 having the characteristics of the conductor in the case of generation of an over-voltage such as ESD, or the like.

Therefore, the over-voltage such as ESD, or the like, may be bypassed to a ground through the ESD protection device 120, such that the signal interface, the IC block, or the communications line may be protected.

The conductive polymer is not particularly limited, but may be, for example, a silicone-based resin.

According to the first exemplary embodiment in the present disclosure, since the discharging part 140 may include the conductive polymer, the silicone-based resin, the ESD protection device 120 needs to be coupled to an outer surface of the capacitor 110 and may not be disposed in the capacitor 110.

The reason for this may be that the silicone based resin may be evaporated and removed in the case in which it is disposed in the capacitor since the silicone based resin has a boiling point significantly lower than a sintering temperature of the ceramic body required at the time of manufacturing the capacitor.

In addition, according to the first exemplary embodiment in the present disclosure, the ESD protection device 120 may bypass the over-voltage such as ESD, or the like, by the first and second electrodes 141 and 142 and the discharging part 140 disposed between the first and second electrodes 141 and 142. However, the varistor may act as an insulator at a rated voltage and act as a variable resistor at the time of generation of the over-voltage to bypass the over-voltage.

According to the first exemplary embodiment in the present disclosure, the protective layer 150 may include an epoxy based resin.

In the ESD protection device 120, the protective layer 150 may serve to protect the first and second electrodes 141 and 142 and the discharging part 140 disposed between the first and second electrodes 141 and 142 from an external environment, and material of the protective layer 150 is not particularly limited.

The protective layer 150 may include an epoxy based resin to protect the first and second electrodes 141 and 142 and the discharging part 140 disposed between the first and second electrodes 141 and 142 from an external environment.

Since the ESD protection device 120 is coupled to the outer surface of the capacitor 110, the protective layer 150 may be a requisite component for protecting the ESD protection device 120 from an external environment.

The composite electronic component according to the first exemplary embodiment in the present disclosure may include an input terminal 131 disposed on the first end surface of the composite body 130 in the length direction and connected to the first internal electrodes 121 of the capacitor 110 and the first electrode 141 of the ESD protection device 120, and a ground terminal 132 formed on the second end surface of the composite body 130 in the length direction and connected to the second internal electrodes 122 of the capacitor 110 and the second electrode 142.

The input terminal 131 and the ground terminal 132 may be connected to the internal electrodes 121 and 122 of the capacitor 110, such that the composite electronic component may serve to filter a noise component of an input signal.

In addition, the input terminal 131 and the ground terminal 132 may be connected to the first and second electrodes 141 and 142 of the ESD protection device 120, respectively, such that the composite electrode component may bypass the over-voltage.

The input terminal 131 and the ground terminal 132 may be formed using a conductive paste containing a conductive metal.

The conductive metal may be nickel (Ni), copper (Cu), tin (Sn), or alloys thereof, but is not limited thereto.

The conductive paste may further contain an insulating material. The insulating material may be, for example, glass, but is not limited thereto.

A method of forming the input terminal 131 and the ground terminal 132 is not particularly limited. For example, the input terminal 131 and the ground terminal 132 may be formed by dipping the composite body or may be formed by a method such as a plating method, or the like.

In addition, although not shown, nickel/tin (Ni/Sn) plating layers formed by plating may be further disposed on outer portions of the input terminal 131 and the ground terminal 132.

Figure 3:
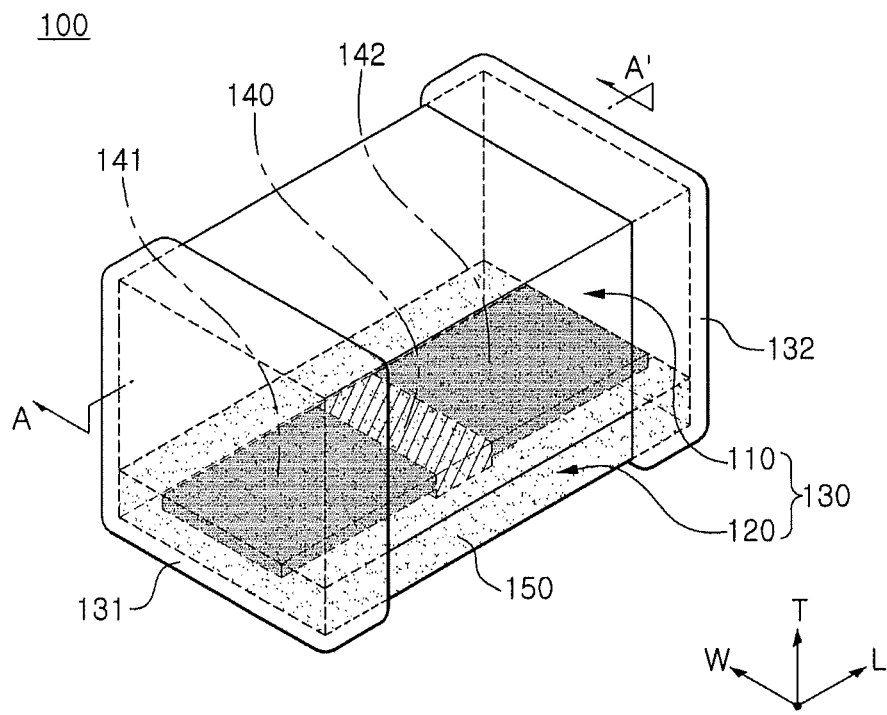
FIG. 3 is a perspective view schematically illustrating a composite electronic component according to a second exemplary embodiment in the present disclosure.

FIG. 3 is a transparent perspective view schematically illustrating a composite electronic component according to a second exemplary embodiment in the present disclosure.

Figure 4:
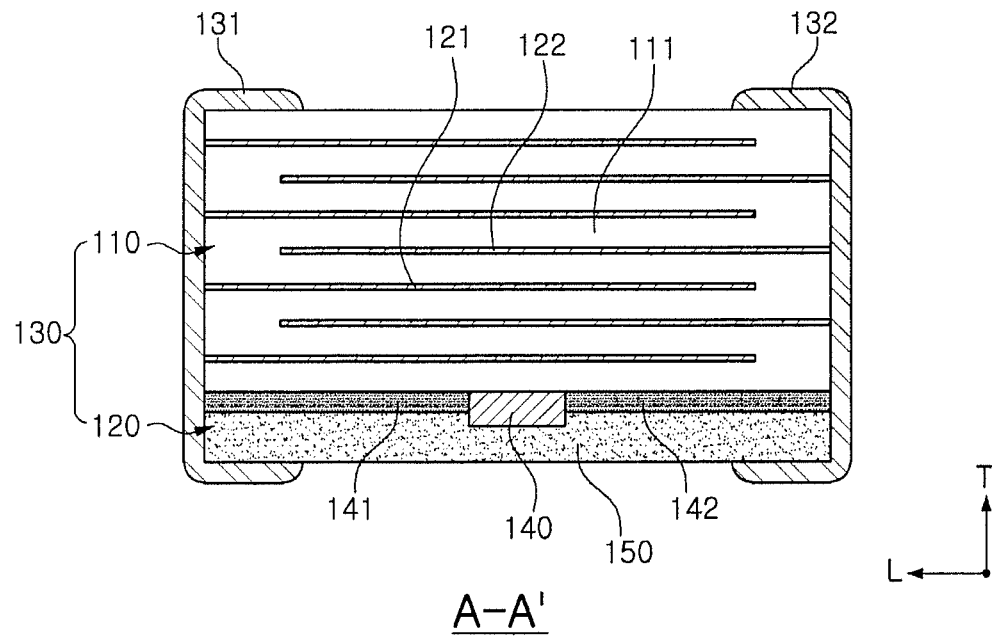
FIG. 4 is a cross-sectional view taken along line A-A' of FIG. 3.

FIG. 4 is a cross-sectional view taken along line A-A' of FIG. 3.

Referring to FIGS. 3 and 4, in addition to features of the composite electronic component according to the first exemplary embodiment in the present disclosure, a composite electronic component according to a second exemplary embodiment in the present disclosure may have a form in which the ESD protection device 120 is disposed on a lower surface of the ceramic body of the capacitor 110.

The ESD protection device 120 may be an ESD suppressor, but is not limited thereto.

Therefore, a phenomenon in which vibrations of the capacitor due to an inverse piezoelectric feature of the capacitor 110 are transferred to a board may be decreased to reduce acoustic noise.

A structure for reducing acoustic noise at the time of mounting the composite electronic component 100 on the board will be described in more detail.

In order to avoid overlapping descriptions, detailed descriptions of features of a composite electronic component 100 according to the second exemplary embodiment in the present disclosure, the same as those of the composite electronic component according to the first exemplary embodiment in the present disclosure described above will be omitted.

Figure 5:
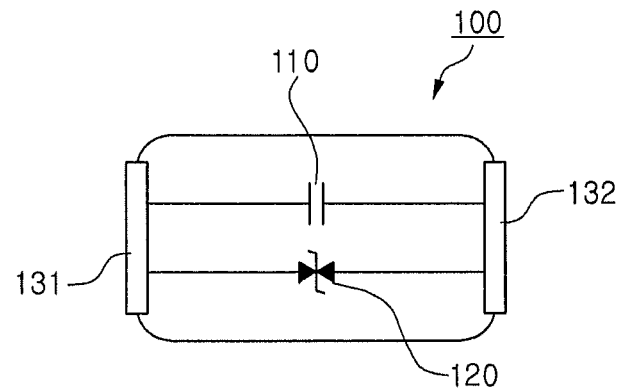
FIG. 5 is an equivalent circuit diagram of the composite electronic component illustrated in FIG. 3.

FIG. 5 is an equivalent circuit diagram of the composite electronic component shown in FIG. 3.

Referring to FIG. 5, in the composite electronic component according to an exemplary embodiment in the present disclosure, the capacitor 110 and the ESD protection device 120 may be coupled to each other, unlike in the case of the related art. Therefore, the capacitor 110 and the ESD protection device 120 may be designed so as to have a relatively shortest distance therebetween, whereby noise may be decreased.

In addition, the capacitor 110 and the ESD protection device 120 may be coupled to each other, such that a mounting area in the signal interface, the IC block, or the communications line is significantly decreased, excellent in terms of securing a mounting space.

In addition, costs required for mounting the composite electronic component may be decreased.

Figure 6:
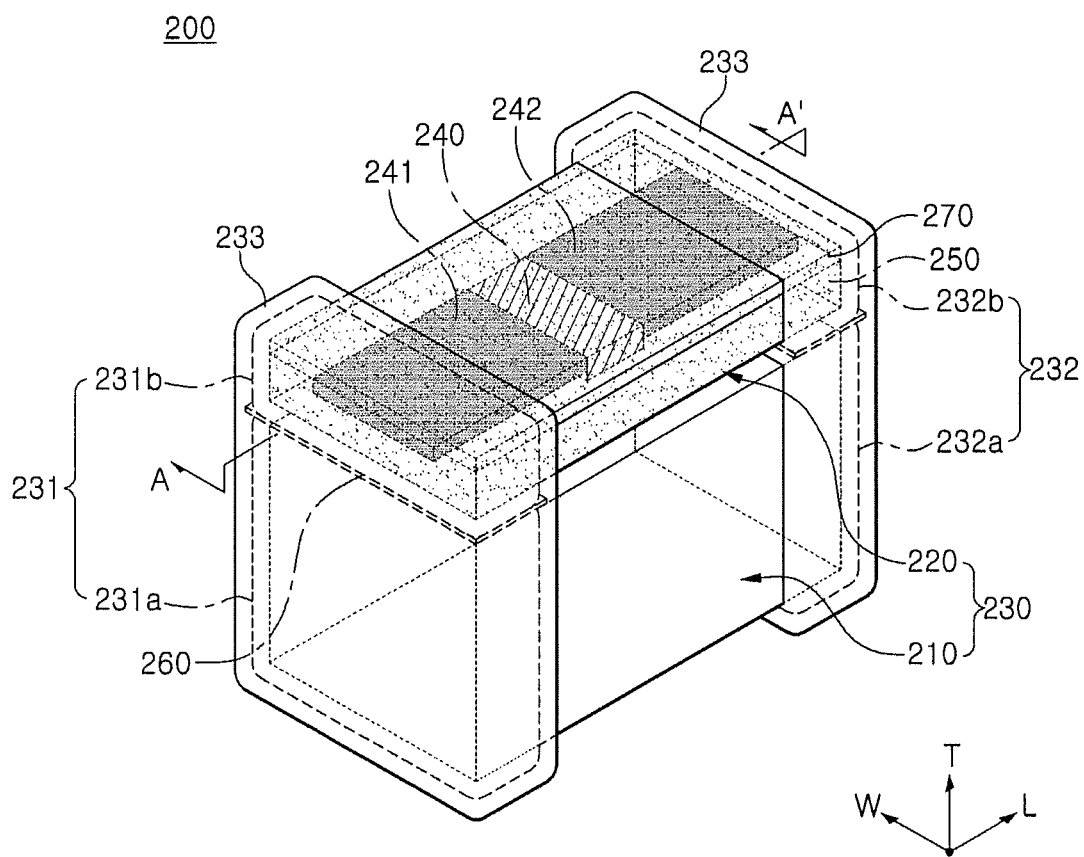
FIG. 6 is a perspective view schematically illustrating a composite electronic component according to a third exemplary embodiment in the present disclosure.

FIG. 6 is a perspective view schematically illustrating a composite electronic component according to a third exemplary embodiment in the present disclosure.

Figure 7:
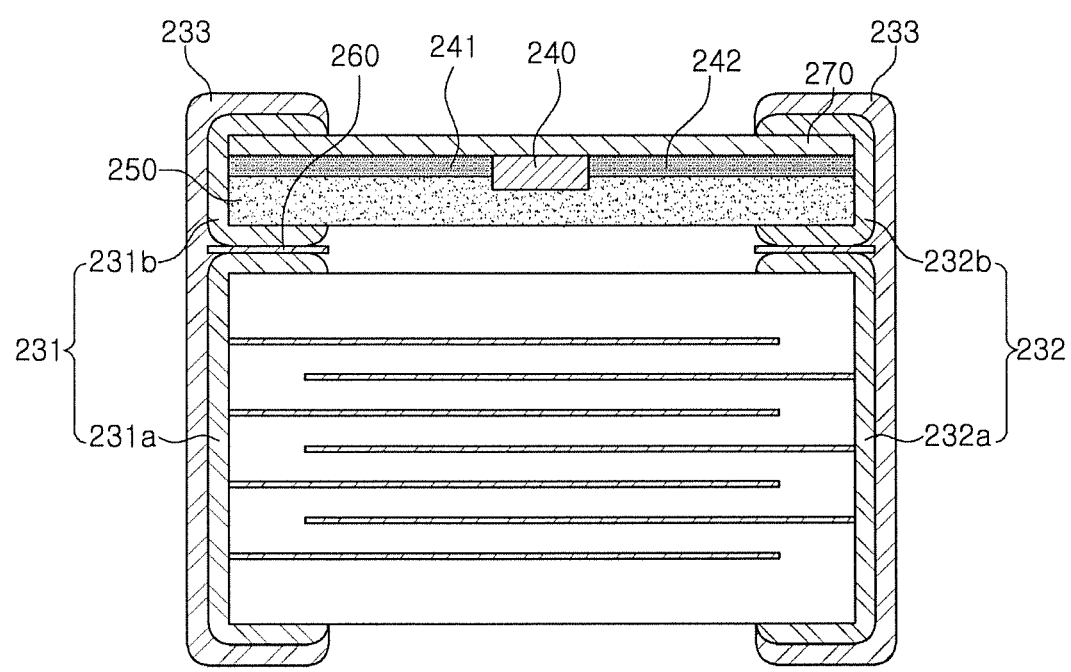
FIG. 7 is a cross-sectional view taken along line A-A' of FIG. 6.

FIG. 7 is a cross-sectional view taken along line A-A' of FIG. 6.

Referring to FIGS. 6 and 7, a composite electronic component 200 according to a third exemplary embodiment in the present disclosure may include a composite body 230 including a capacitor 210 and an ESD protection device 220 coupled to each other, the capacitor 210 including a ceramic body in which a plurality of dielectric layers 211 and a plurality of first and second internal electrodes 221 and 222 disposed so as to face each other with a respective dielectric layer 211 interposed therebetween are stacked, and the ESD protection device 220 including a substrate 270, first and second electrodes 241 and 242 disposed below the substrate 270 and insulated from each other, a discharging part 240 disposed between the first and second electrodes 241 and 242, and a protective layer 250 disposed below the first and second electrodes 241 and 242 and the discharging part 240.

In addition, the composite electronic component 200 according to the third exemplary embodiment in the present disclosure may include a first external electrode 231*a* disposed on a first end surface of the ceramic body in the length direction and connected to the first internal electrodes 221 of the capacitor 210, a second external electrode 232*a* disposed on a second end surface of the ceramic body in the length direction and connected to the second internal electrodes 222 of the capacitor 210, a third external electrode 231*b* disposed on a first end surface of the ESD protection device 220 in the length direction and connected to the first electrode 241, and a fourth external electrode 232*b* disposed on a second end surface of the ESD protection device 220 in the length direction and connected to the second electrode 242.

In addition, the composite body 230 may include an input terminal 231 configured of the first and third external electrodes 231*a* and 231*b* coupled to each other and a ground terminal 232 configured of the second and fourth external electrodes 232*a* and 232*b* coupled to each other.

The ESD protection device 220 may be an ESD suppressor, but is not limited thereto.

The first external electrode 231*a* may be formed on the first end surface of the ceramic body in the length direction, but may also be extended to the third and fourth side surfaces of the ceramic body in the width direction and the upper and lower surfaces of the ceramic body.

The second external electrode 232*a* may be formed on the second end surface of the ceramic body in the length direction, but may also be extended to the third and fourth side surfaces of the ceramic body in the width direction and the upper and lower surfaces of the ceramic body.

The third external electrode 231b may be formed on the first end surface of the ESD protection device 220 in the length direction, but may also be extended to the third and fourth side surfaces of the ESD protection device 220 in the width direction and the upper and lower surfaces of the ESD protection device 220.

The fourth external electrode 232b may be formed on the second end surface of the ESD protection device 220 in the length direction, but may also be extended to the third and fourth side surfaces of the ESD protection device 220 in the width direction and the upper and lower surface of the ESD protection device 220.

The capacitor 210 and the ESD protection device 220 may be coupled to each other by a conductive adhesive 260.

In the composite electronic component 200 according to the third exemplary embodiment of the present disclosure, since the capacitor 210 and the ESD protection device 220, separately manufactured, are vertically coupled to each other, the conductive adhesive 260 may be applied onto coupled surfaces of the capacitor 210 and the ESD protection device 220 to couple the capacitor 210 and the ESD protection device 220 to each other.

The conductive adhesive 260 is not particularly limited, but may be, for example, a polymer paste containing silver (Ag).

According to the third exemplary embodiment in the present disclosure, at the time of vertically coupling the capacitor 210 and the ESD protection device 220, separately manufactured, the first and second electrodes 241 and 242 and the discharging part 240 may be disposed so as to be spaced apart from the capacitor 210 as distant as possible.

For example, in the ESD protective layer 220 coupled to the capacitor 210, the protective layer 250 may be disposed on the capacitor 210, and the first and second electrodes 241 and 242 and the discharging part 240 may be disposed on the protective layer 250.

Therefore, when the over-voltage such as ESD, or the like, is generated in a state in which the composite electronic component is mounted on the board, an effect of bypassing the over-voltage such as ESD, or the like, and protecting the capacitor 210 from the over-voltage through the first and second electrodes 241 and 242 and the discharging part 240 may be further improved.

However, the present disclosure is not limited thereto. For example, the first and second electrodes 241 and 242 and the discharging part 240 may also be disposed adjacent to the capacitor 210.

In the composite electronic component 200 according to the third exemplary embodiment in the present disclosure, since the capacitor 210 and the ESD protection device 220 are separately manufactured and coupled to each other unlike an integrated structure according to the related art, a manufacturing process may be simple and there are no limitations in selecting materials.

In detail, since the capacitor 210 and the ESD protection device 220 are coupled to each other by the conductive adhesive 260, when the over-voltage such as ESD, or the like, is instantaneously generated, the over-voltage may be bypassed through the ESD protection device 220, such that influence of the over-voltage on the capacitor 210 may be significantly decreased. Therefore, the capacitor 210 may be protected.

For example, since the capacitor 210 and the ESD protection device 220, separately manufactured, are coupled to each other by the conductive adhesive 260, such that they are closely spaced apart from each other, the capacitor 210 may be protected from over-voltage such as ESD, or the like.

In addition, plating layers 233 formed by plating may be disposed on outer portions of the input terminal 231 and the ground terminal 232. Here, the plating layer 233 is not particularly limited, but may be, for example, a nickel/tin (Ni/Sn) plating layer.

The plating layers 233 may protect the input terminal 231 configured of the first and third external electrodes 231a and 231b coupled to each other and the ground terminal 232 configured of the second and fourth external electrodes 232a and 232b coupled to each other and complement the external electrodes of the capacitor and the ESD protection device so as to be coupled to each other to perform functions of input and ground terminals.

The substrate 270 may be any substrate as long as the first and second electrodes 241 and 242 may be formed thereon. For example, the substrate 270 may be an alumina substrate.

In order to avoid an overlapping description, a detailed description of features of a composite electronic component 200 according to the third exemplary embodiment in the present disclosure, the same as those of the composite electronic component according to the first exemplary embodiment in the present disclosure described above will be omitted.

Figure 8:
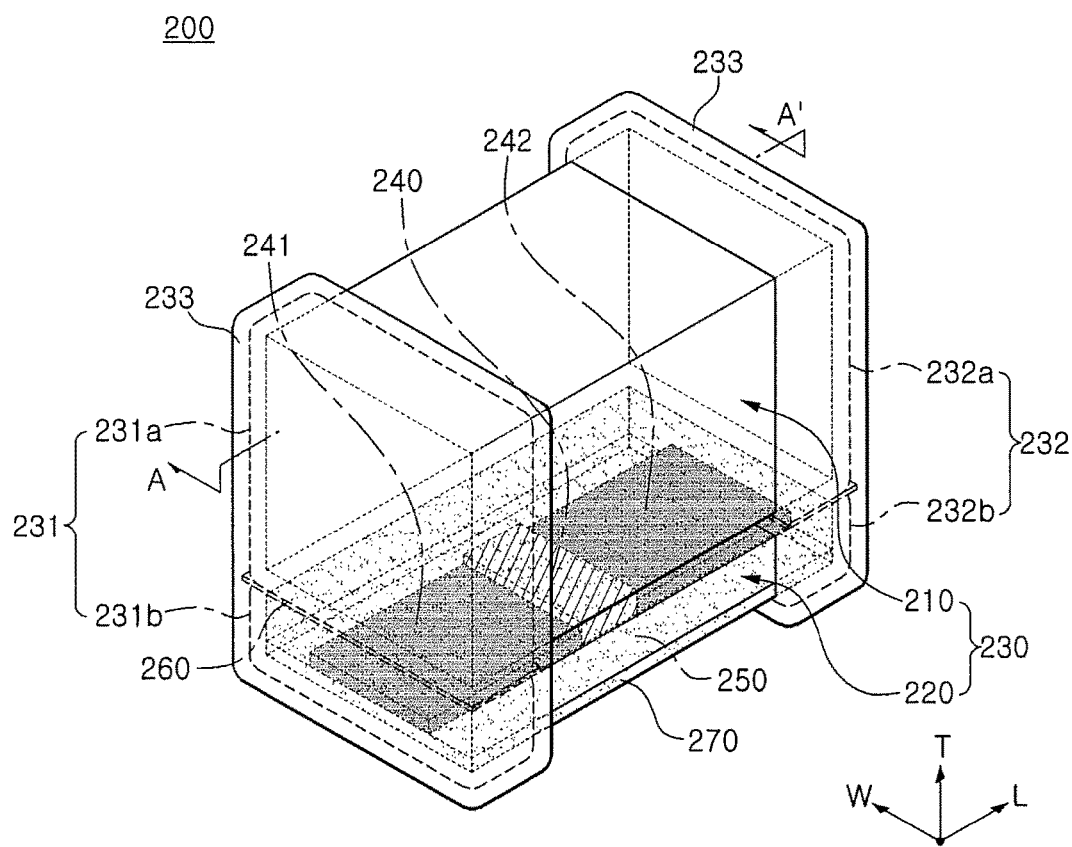
FIG. 8 is a perspective view schematically illustrating a composite electronic component according to a fourth exemplary embodiment in the present disclosure.

FIG. 8 is a transparent perspective view schematically illustrating a composite electronic component according to a fourth exemplary embodiment in the present disclosure.

Figure 9:
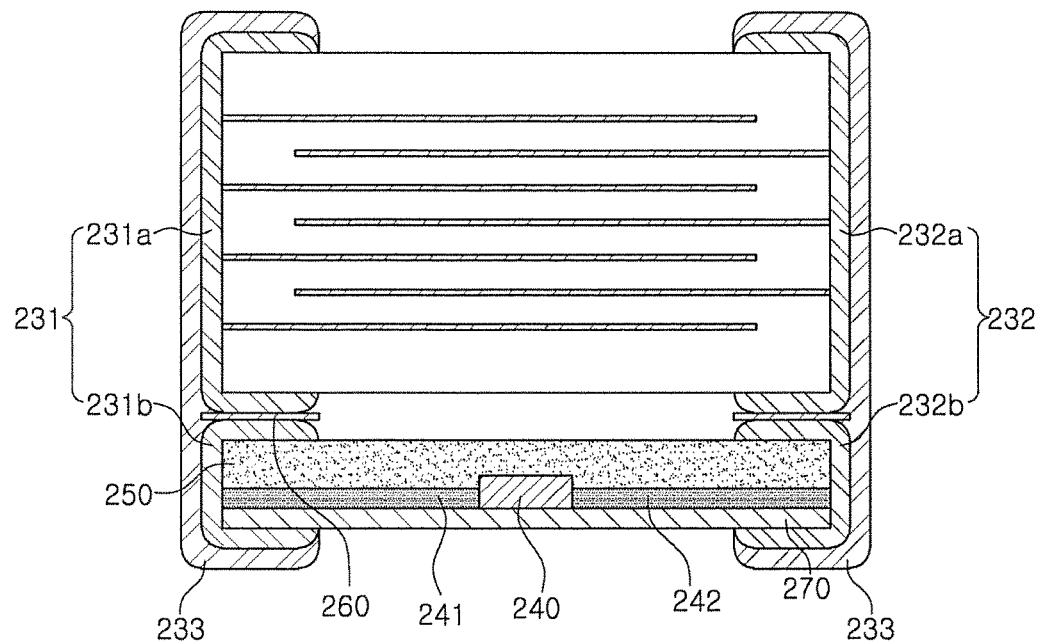
FIG. 9 is a cross-sectional view taken along line A-A' of FIG. 8.

FIG. 9 is a cross-sectional view taken along line A-A' of FIG. 8.

Referring to FIGS. 8 and 9, in addition to features of the composite electronic component according to the third exemplary embodiment in the present disclosure, a composite electronic component 200 according to a fourth exemplary embodiment in the present disclosure may have a form in which the ESD protection device 220 is disposed on a lower surface of the ceramic body of the capacitor 210.

The ESD protection device 220 may be an ESD suppressor, but is not limited thereto.

According to the fourth exemplary embodiment in the present disclosure, at the time of coupling the separately manufactured ESD protection device 220 to a lower surface of the ceramic body of the capacitor 210, the first and second electrodes 241 and 242 and the discharging part 240 may be disposed so as to be spaced apart from the capacitor 210 by as large a distance as possible.

For example, in the ESD protection device 220 coupled to the capacitor 210, the protective layer 250 may be disposed adjacently to the capacitor 210, and the first and second electrodes 241 and 242 and the discharging part 240 may be disposed below the protective layer 250.

Therefore, in the case in which an over-voltage such as ESD, or the like, is generated in a state in which the composite electronic component is mounted on the board, an effect of bypassing the over-voltage such as ESD, or the like, and protecting the capacitor 210 from the over-voltage through the first and second electrodes 241 and 242 and the discharging part 240 may be further improved.

However, the present disclosure is not limited thereto. For example, the first and second electrodes 241 and 242 and the discharging part 240 may also be disposed adjacently to the capacitor 210.

The ESD protection device 220 may be disposed on the lower surface of the ceramic body of the capacitor 210 to decrease a phenomenon in which vibrations of the capacitor 210, due to an inverse piezoelectric feature of the capacitor 210, are transferred to the board, thereby decreasing acoustic noise.

A structure decreasing the acoustic noise at the time of mounting the composite electronic component 200 on the board will be described in more detail.

Meanwhile, a composite electronic component according to another exemplary embodiment in the present disclosure may include a composite body in which a noise filter unit and an ESD protection device disposed below the noise filter unit are coupled to each other; and an input terminal and a ground terminal coupled to the composite body, and the noise filter unit filters a noise component of an input signal input to the input terminal, and the ESD protection device bypasses an over-voltage input to the input terminal.

The composite electronic component according to another exemplary embodiment in the present disclosure will be described in more detail with the accompanying drawings.

Figure 10:
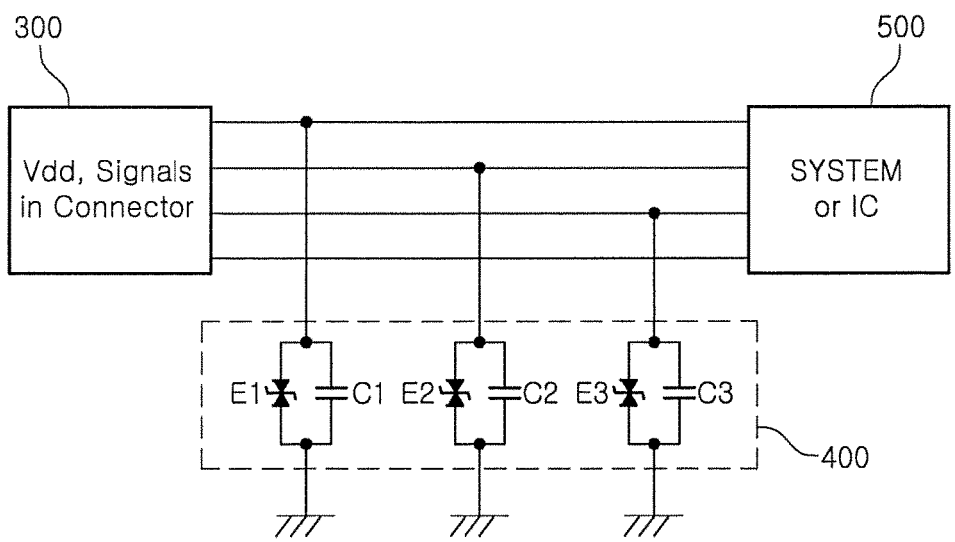
FIG. 10 is a view illustrating a signal interface through which signals are transferred from a connector to a system or an integrated circuit (IC)

FIG. 10 is a view illustrating a signal interface through which signals are transferred from a connector to a system or an integrated circuit (IC).

Referring to FIG. 10, the signal interface through which the signals are transferred from the connector to the system or the IC may include a connector 300 such as an output terminal Vdd, a signal unit Signals, or the like, a signal stabilizing unit 400, and a system or an IC 500.

The connector 300 may supply the signals to the signal stabilizing unit 400. The signals may have a rated voltage and current and may be transferred to the system or the IC 500.

The connector 300 may be the output terminal Vdd, a signal input and output terminal Signal+ and Signal−, or a ground terminal, but is not limited thereto.

The signal stabilizing unit 400 may include a noise filter unit filtering noise components in the signals input from the connector 300 and an ESD protection device bypassing an over-voltage.

In detail, the signal stabilizing unit 400 may include capacitors C1 to C3 filtering the noise components in the input signals and bypassing a portion of the over-voltage, and ESD protection devices E1 to E3.

Although the case in which the number of capacitors C1 to C3 filtering the noise components in the input signals and bypassing a portion of the over-voltage, and the number of the ESD protection devices E1 to E3 are 3, respectively, has been shown in FIG. 10, the numbers of capacitors C1 to C3 and the ESD protection devices E1 to E3 are not limited thereto, but may be adjusted, as necessary.

In addition, the capacitors C1 to C3, which serve to filter noise components and bypass a portion of the over-voltage, may be low-capacitance capacitors having a capacitance of 100 pF to 1 nF.

The capacitors C1 to C3 may bypass a portion of the over-voltage, and the majority of the over-voltage may be bypassed through the ESD protection devices E1 to E3.

The signals input from the connector 300 pass through the stabilizing unit 400, such that the noise component of the signals may be filtered and the over-voltage, or the like, that may be instantaneously generated may be bypassed. Then, the signals from which the noise components are filtered and of which the over-voltage, or the like, is bypassed may be transferred to the system or the IC 500.

Figure 11:
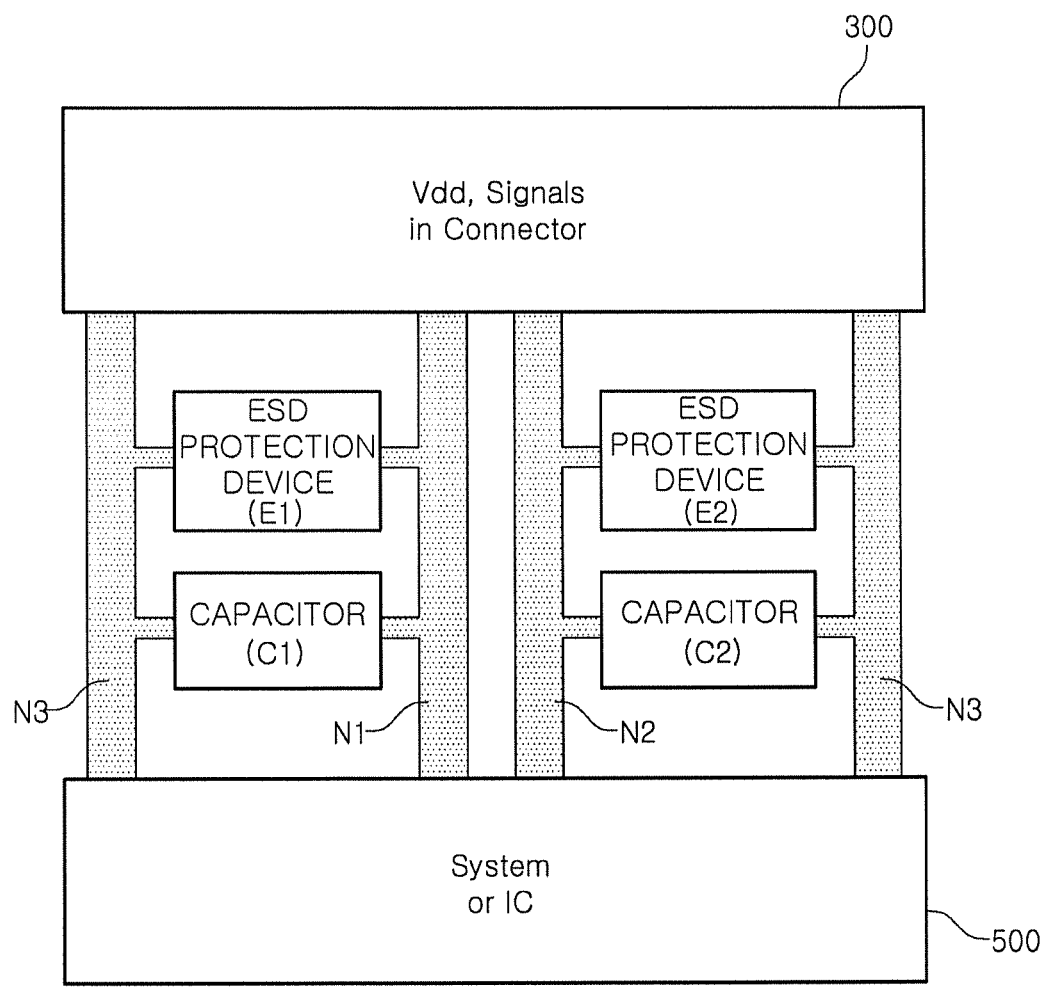
FIG. 11 is a view illustrating a pattern for a layout of a device between a connector and a system or an IC.

FIG. 11 is a view illustrating a device layout pattern between the connector and the system or the IC.

Referring to FIG. 11, disposition patterns of the connector 300 such as the output terminal Vdd, the signal unit Signals, or the like, the signal stabilizing unit 400, and the system or the IC 500 may be confirmed.

Generally, the connector 300 such as the output terminal Vdd, the signal unit Signals, or the like, and the system or the IC 500 may include several capacitors to several tens of capacitors or several ESD protection devices to several tens of ESD protection devices disposed therebetween.

Referring to FIG. 11, the connector 300 such as the output terminal Vdd, the signal unit Signals, or the like, may have predetermined terminals N1 and N2. The connector 300 such as the output terminal Vdd, the signal unit Signals, or the like, may supply power or the signals through the first and second terminals N1 and N2.

Here, the capacitor C1 may receive power or the signals through the first and second terminals N1 and N2, stabilize the received power and signals, and transfer the stabilized power and signals to the system or the IC 500.

In addition, the capacitor C1 and the ESD protection device E1 may bypass the over-voltage such as ESD, or the like, to a ground through a third terminal N3.

It needs to be importantly considered in designing patterns of the signal interface, the IC block, or the communications line that the capacitor, the ESD protection device, the IC, and the like, are to be disposed as closely to each other as possible.

The reason may be that the requirements as described above need to be satisfied in order to reduce the area of a component and suppress generation of noise.

In the case in which the capacitor and ESD protection device are disposed in a non-optimal state, the distance between the capacitor and ESD protection device and a power line may be increased, such that noise may occur. The noise may have a negative influence on the system or the IC.

Figure 12:
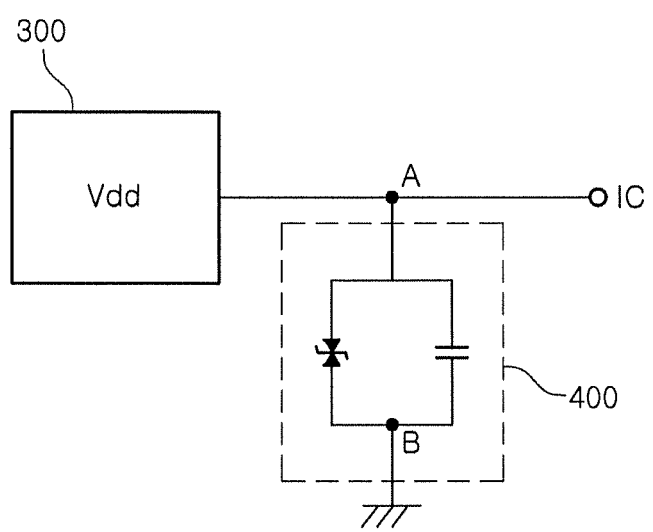
FIG. 12 is a circuit diagram of the composite electronic component according to an exemplary embodiment in the present disclosure.

FIG. 12 is a circuit diagram of the composite electronic component according to an exemplary embodiment in the present disclosure.

Referring to FIG. 12, the composite electronic component 400 may include an input terminal unit A (input terminal), a signal stabilizing unit, and a ground terminal unit B (ground terminal).

The signal stabilizing unit may include a capacitor C1 and an ESD protection device E1.

The composite electronic component 400 may perform a function of the signal stabilizing unit described above.

The input terminal unit A may receive the signals from the connector 300 such as the output terminal Vdd, or the like.

The signal stabilizing unit may remove noise of the signals received from the input terminal unit A and bypass an over-voltage, or the like.

The ground terminal unit B may connect the signal stabilizing unit to a ground.

For example, the composite electronic component 400 may allow the capacitor and the ESD protection device provided between the connector 300 such as the output terminal Vdd, the signal unit Signals, or the like, and the system or the IC 500 to be implemented as a single component. Therefore, the degree of integration of devices may be improved due to the composite electronic component 400.

Figure 13:
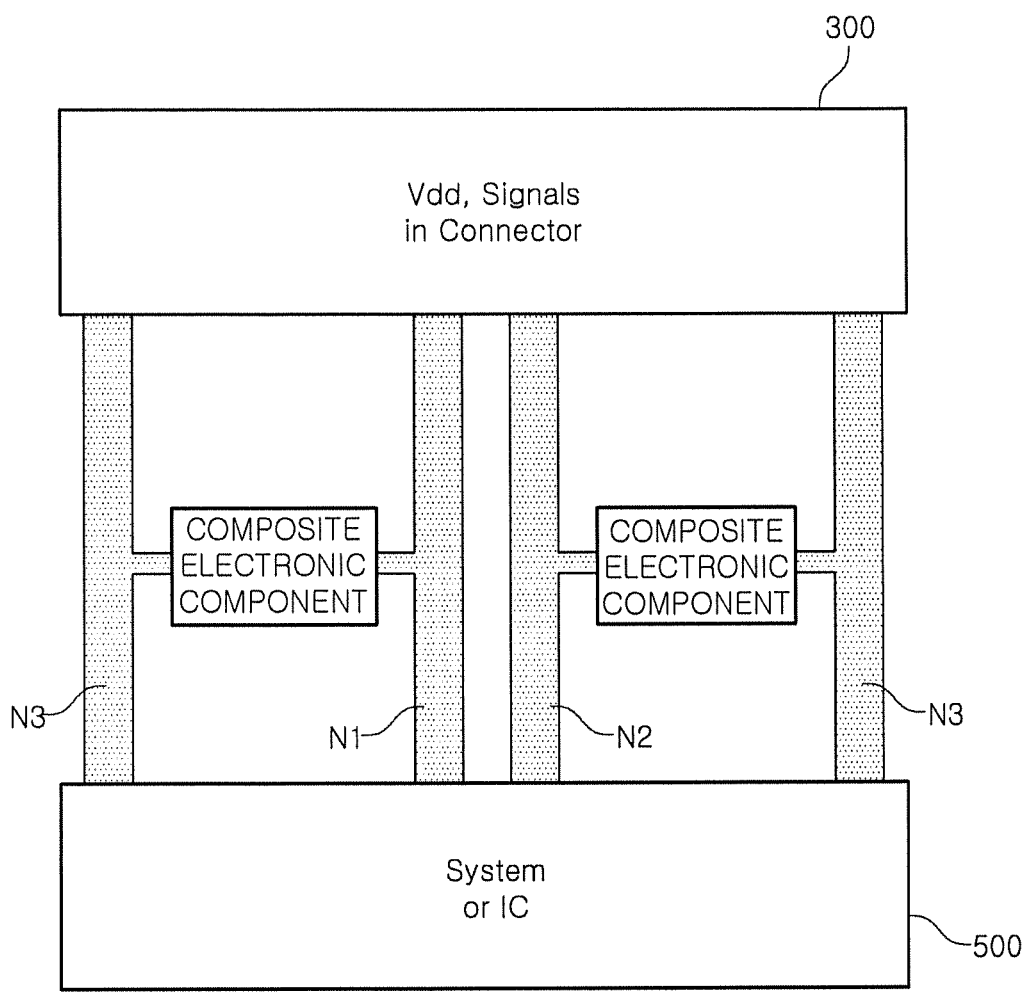
FIG. 13 is a view illustrating a device layout pattern in which the composite electronic components according to an exemplary embodiment in the present disclosure are used between a connector and a system or an IC.

FIG. 13 is a view illustrating a device layout pattern in which the composite electronic components according to an exemplary embodiment of the present disclosure are used between the connector and the system or the IC.

Referring to FIG. 13, it may be confirmed that the capacitors C1 and C2 and the ESD protection devices E1 and E2 shown in FIG. 11 are replaced by the composite electronic components according to an exemplary embodiment in the present disclosure.

In addition, the composite electronic component may perform functions of the signal stabilizing unit such as filtering noise, bypassing an over-voltage such as ESD, and the like.

In addition, the capacitors C1 and C2 and the ESD protection devices E1 and E2 are replaced by the composite electronic components according to an exemplary embodiment in the present disclosure, whereby length of wiring may be significantly decreased. In addition, the number of devices disposed is decreased, whereby the devices may be properly disposed.

Meanwhile, electronic apparatus manufacturers have made an effort to reduce the size of a printed circuit board (PCB) included in an electronic apparatus in order to satisfy consumer demand. Therefore, it has been required to increase the degree of integration of ICs mounted on the PCB. As in the composite electronic component according to an exemplary embodiment in the present disclosure, a plurality of devices are implemented as a single composite component, whereby this demand may be satisfied.

Further, according to an exemplary embodiment in the present disclosure, two components (capacitor and ESD protection device) are implemented as a single composite electronic component, whereby the area in which they are mounted on the PCB may be reduced. According to an exemplary embodiment in the present disclosure, the area in which components are mounted may be reduced as compared with an existing disposition pattern by about 50% or more.

In addition, the composite electronic component according to an exemplary embodiment in the present disclosure may be used in a high speed data line, a universal serial bus (USB) 3.0 or higher line, a high definition multimedia interface (HDMI) line, and the like, and may be used in a cable interconnecting electronic boards or an external port in products configuring electronic boards, for example, in vehicles, television (TV) sets, and the like.

Since this application has a high data rate, a very high reaction speed, and a high frequency band, the ESD protection device needs to be appropriate.

For example, in the composite electronic component according to an exemplary embodiment in the present disclosure, the ESD protection device may be an ESD suppressor that may be used in the high speed data line, the USB 3.0 or higher line, the HDMI line, and an external port having a high data rate, a very high reaction speed, and a high frequency band.

Method of Manufacturing Composite Electronic Component

A method of manufacturing a composite electronic component according to another exemplary embodiment in the present disclosure may include preparing a capacitor configured of a ceramic body in which a plurality of dielectric layers and internal electrodes disposed so as to face each other with a respective dielectric layer interposed therebetween are stacked; forming first and second electrodes on the ceramic body so as to be insulated from each other; applying a paste containing a conductive polymer between the first and second electrodes to prepare a discharging part; applying an insulating resin onto the first and second electrodes and the discharging part to prepare an ESD protection device; and forming an input terminal and a ground terminal on both end surfaces of a composite body in a length direction, respectively, the composite body being formed by coupling the capacitor configured of the ceramic body and the ESD protection device formed on the ceramic body to each other.

Hereinafter, the method of manufacturing a composite electronic component according to another exemplary embodiment in the present disclosure will be described. However, the present disclosure is not limited thereto.

In the method of manufacturing a composite electronic component, the capacitor configured of the ceramic body in which the plurality of dielectric layers and the internal electrodes disposed so as to face each other with a respective dielectric layer interposed therebetween are stacked may be first prepared.

A method of preparing the capacitor configured of the ceramic body is not particularly limited, but may be the same as a general method of manufacturing a capacitor.

For example, a slurry containing a powder such as barium titanate ($BaTiO_3$) powder, or the like, having an average particle size of 0.5 μm or less may be applied and dried on carrier films to prepare a plurality of ceramic green sheets.

Next, a conductive paste for an internal electrode containing nickel powder particles having an average particle size of 0.5 μm or less may be prepared.

The conductive paste for an internal electrode may be prepared by adding barium titanate ($BaTiO_3$) powder separately from, and in addition to, a nickel powder.

The a conductive paste for an internal electrode may be applied onto the ceramic green sheets by a screen printing method to form the internal electrodes, and 100 to 300 ceramic green sheets on which the internal electrodes are formed may be stacked to form a multilayer body.

Then, the multilayer body may be compressed and cut to manufacture a chip having a necessary size, thereby preparing a ceramic body.

Next, the first and second electrodes may be formed on the ceramic body so as to be insulated from each other.

This process of forming the first and second electrodes is not particularly limited, but may be performed by, for example, a printing method using a paste containing a metal such as copper (Cu), or the like.

Shapes of the first and second electrodes are not particularly limited, but may be the same as those of the internal electrodes in the ceramic body.

The first and second internal electrodes may be formed on the same plane, may be exposed to first and second end surfaces of the ESD protection device in the length direction, respectively, and may be internally spaced apart from each other to thereby be insulated from each other.

Next, the paste containing the conductive polymer may be applied between the first and second electrodes to prepare the discharging part.

This process of applying the paste containing the conductive polymer between the first and second electrodes is not particularly limited, but may be performed by a printing method.

Next, the insulating resin may be applied onto the first and second electrodes and the discharging part to prepare the ESD protection device.

The insulating resin may be any material that may protect the first and second electrodes and the discharging part from the outside, and for example, may be an epoxy based resin.

Next, the input terminal and the ground terminal may be formed on both end surfaces of the composite body in the length direction thereof, respectively, and the composite body is formed by coupling the capacitor including the ceramic body and the ESD protection device formed on the ceramic body to each other.

The input terminal may be formed on the first end surface of the composite body in the length direction, and the ground terminal may be formed on the second end surface thereof in the length direction.

A process of forming the input terminal and the ground terminal may be performed by applying a conductive paste containing a metal such as copper (Cu), or the like, and a conductive paste containing an insulating material such as glass, or the like onto both end surfaces of the composite body in the length direction.

The process of forming the input terminal and the ground terminal may be performed by a dipping method or a printing method, but is not limited thereto.

Next, plating layers may be formed on the input terminal and the ground terminal by a method such as a plating method, or the like, to manufacture the composite electronic component.

The plating layers are not particularly limited, but may be, for example, nickel/tin (Ni/Sn) plating layers.

Board for Mounting of Composite Electronic Component

Figure 14:
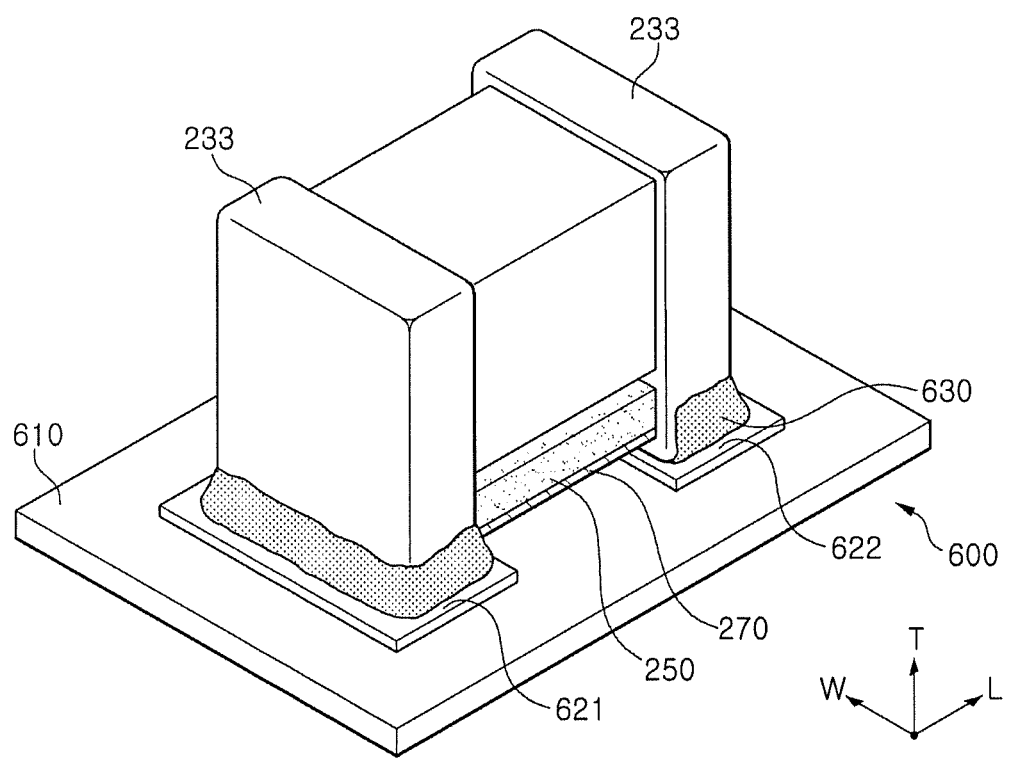
FIG. 14 is a perspective view illustrating a manner in which the composite electronic component of FIG. 8 is mounted on a printed circuit board.

FIG. 14 is a perspective view illustrating a manner in which the composite electronic component of FIG. 8 is mounted on a printed circuit board.

Referring to FIG. 14, a board 600 for mounting of a composite electronic component 200 according to the exemplary embodiment in the present disclosure may include a printed circuit board 610 on which the composite electronic component 200 is mounted and two electrode pads 621 and 622 disposed on an upper surface of the printed circuit board 610.

The electrode pads 621 and 622 may be first and second electrode pads 621 and 622 connected to the input terminal 231 and the ground terminal 232 of the composite electronic component, respectively.

Here, the input terminal 231 and the ground terminal 232 of the composite electronic component 200 may be electrically connected to the printed circuit board 610 by solder 630 in a state in which they are positioned on the first and second electrode pads 621 and 622, respectively, so as to contact the first and second electrode pads 621 and 622, respectively.

When a voltage is applied to the composite electronic component 200 in a state in which the composite electronic component 200 is mounted on the printed circuit board 610, acoustic noise may occur.

Here, sizes of the first and second electrode pads 621 and 622 may become indices in determining the amount of solder 630 connecting the input terminal 231 and the ground terminal 232 of the composite electronic component 200 and the first and second electrode pads 621 and 622 to each other, respectively, and the magnitude of the acoustic noise may be adjusted depending on the amount of solder 630.

Meanwhile, when voltages having different polarities are applied to the input terminal 231 and the ground terminal 232 formed on both end surfaces of the composite electronic component 200 in the length direction, respectively, in a state in which the composite electronic component 200 is mounted on the printed circuit board 610, the ceramic body may be expanded and contracted in the thickness direction due to an inverse piezoelectric effect of the dielectric layers 211, and both end portions of the input terminal 231 and the ground terminal 232 in the length direction may be contracted and expanded in directions opposite to the expansion and contraction directions of the ceramic body in the thickness direction, due to the Poisson effect.

Here, in the composite electronic component according to an exemplary embodiment in the present disclosure, the ESD protection device is disposed on the lower surface of the ceramic body of the capacitor to reduce the phenomenon in which vibrations of the capacitor due to the inverse piezoelectric feature of the capacitor are transferred to the board at the time of mounting the composite electronic component on the board, whereby acoustic noise may be reduced.

In addition, in the composite electronic component according to an exemplary embodiment in the present disclosure, the ESD protection device is disposed on the lower surface of the ceramic body of the capacitor, such that the capacitor may be disposed at a distance distant from the board, whereby the capacitor may be protected even though cracks, or the like, occur in the composite electronic component.

Further, in the composite electronic component according to an exemplary embodiment in the present disclosure, the ESD protection device is disposed on the lower surface of the ceramic body of the capacitor, such that the distance between the ESD protection device and the board is close to reduce parasitic pattern resistance or parasitic inductance, whereby a side effect may be reduced.

For example, the parasitic pattern resistance or the parasitic inductance may be reduced, whereby frequency characteristics may be improved and characteristics of the composite electronic component filtering a noise component without distorting signals and bypassing a portion of an over-voltage may be improved.

Packaging Unit of Composite Electronic Component

Figure 15:
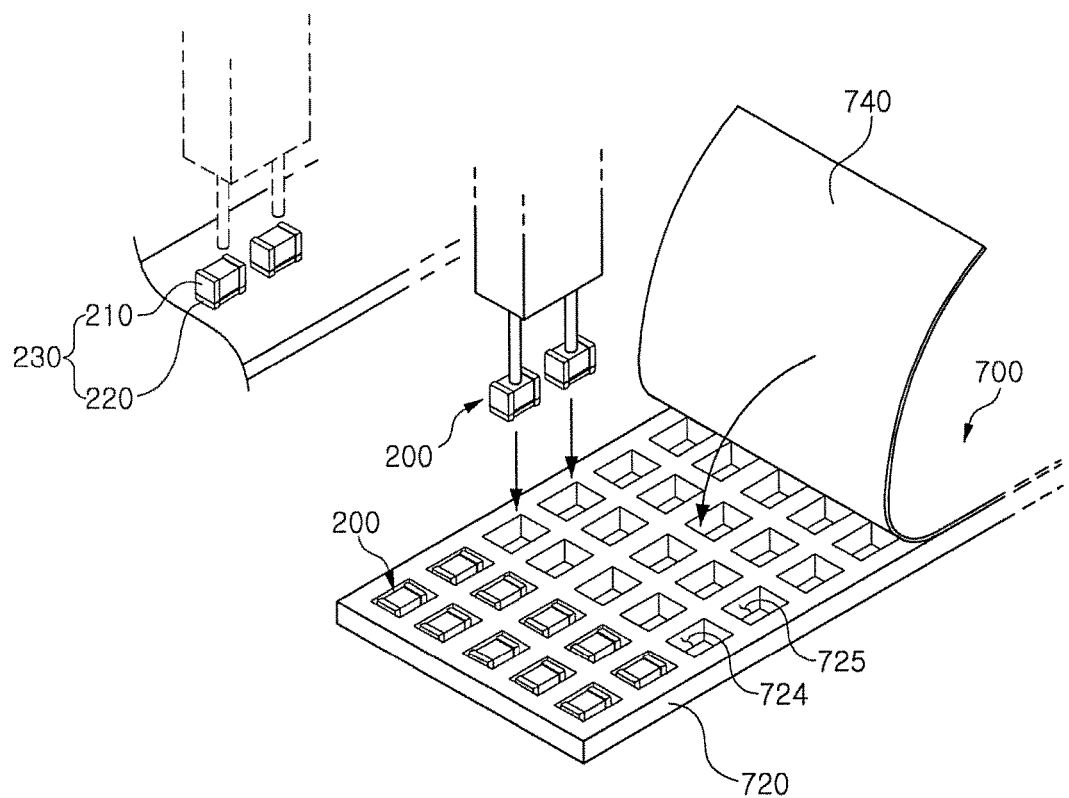
FIG. 15 is a schematic perspective view illustrating a manner in which the composite electronic components of FIG. 8 are mounted in a packaging unit.

FIG. 15 is a schematic perspective view illustrating a manner in which the composite electronic components of FIG. 8 are mounted in a packaging unit.

Figure 16:
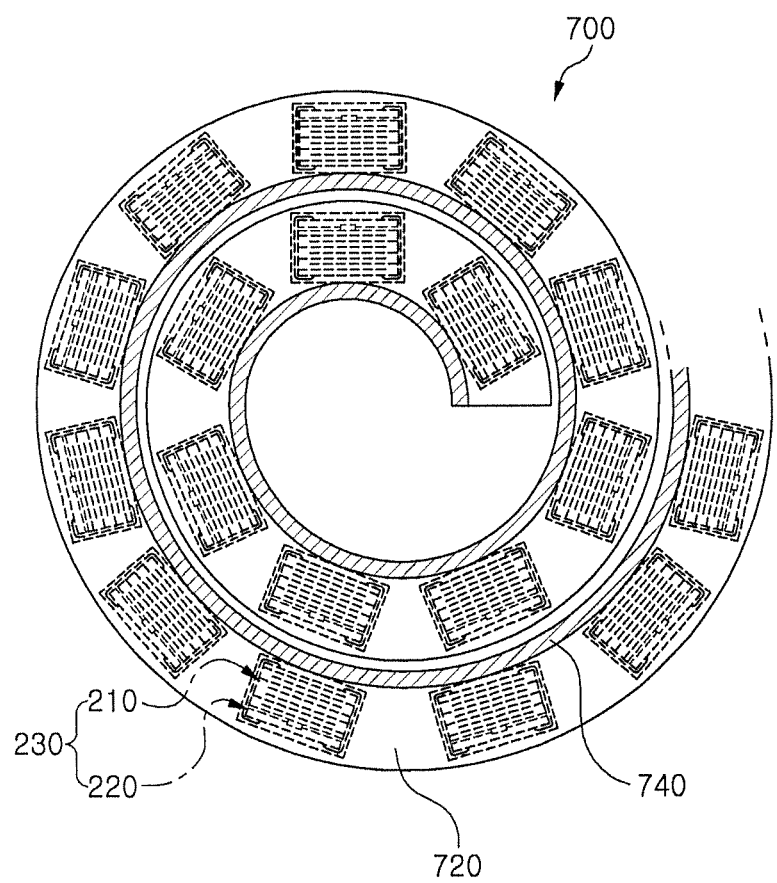
FIG. 16 is a schematic cross-sectional view illustrating a packaging unit of FIG. 15 coiled in a coil shape.

FIG. 16 is a schematic cross-sectional view illustrating a packaging unit of FIG. 15 coiled in a coil shape.

Referring to FIG. 15, a packaging unit 700 of a composite electronic component according to the exemplary embodiment in the present disclosure may include a packaging sheet 720 having receiving parts 724 formed therein, the receiving parts 724 receiving the composite electronic components 200 therein.

The receiving parts 724 of the packaging sheet 720 may have shapes corresponding to those of the composite electronic components 200, and the internal electrodes may be disposed horizontally, based on bottom surfaces 725 of the receiving parts 724.

In detail, respective composite electronic components 200 received in the receiving parts 724 may be disposed so that the ESD protection device 220 thereof is directed toward the bottom surface of the receiving part 724.

The composite electronic components 200 may be maintained in a state in which the internal electrodes thereof are horizontally aligned with each other through an electronic component aligning apparatus and be moved to the packaging sheet 720 through a transferring apparatus.

Therefore, respective composite electronic components 200 received in the receiving parts 724 may be disposed so that the ESD protection device 220 thereof is directed toward the bottom surface of the receiving part 724.

Through such a method, a plurality of composite electronic components 200 in the packaging sheet 720 may be disposed to have the same directionality in the packaging sheet 720.

The packaging unit 700 of the composite electronic component may further include a packaging film 740 covering the packaging sheet 720 in which the composite electronic components 200 having the internal electrodes disposed horizontally based on the bottom surfaces of the receiving parts 724 and the ESD protection devices 220 disposed so as to be directed toward the bottom surfaces of the receiving parts 724 are received.

The packaging unit 700 of a composite electronic component coiled in the coil shape shown in FIG. 16 may be obtained through continuous coiling operation.

As set forth above, according to exemplary embodiments in the present disclosure, the composite electronic component capable of being mounted in a reduced area may be provided.

While exemplary embodiments have been shown and described above, it will be apparent to those skilled in the art that modifications and variations could be made without departing from the spirit and scope of the present disclosure as defined by the appended claims.

What is claimed is:

1. A composite electronic component comprising:
   a composite body including a capacitor and an electrostatic discharge (ESD) protection device coupled to each other, the capacitor including a ceramic body in which a plurality of dielectric layers and internal electrodes are stacked with a respective dielectric layer interposed between the internal electrodes, and the ESD protection device including first and second electrodes disposed on the ceramic body, a discharging part disposed between the first and second electrodes, and a protective layer disposed on the first and second electrodes and the discharging part to substantially cover the entirety of upper surfaces of the first and second electrodes and the discharging part;
   an input terminal disposed to cover an entirety of a first end surface of the composite body in a length direction of the composite body, partially disposed on a surface of the protective layer in a thickness direction, and connected to internal electrodes of the capacitor and the first electrode; and
   a ground terminal disposed to cover an entirety of a second end surface of the composite body in the length direction, partially disposed on a surface of the protective layer in a thickness direction, and connected to internal electrodes of the capacitor and the second electrode,
   wherein the protective layer ends, in the length direction, at a respective end surface of the composite body.

2. The composite electronic component of claim 1, wherein the ESD protection device is disposed on a lower surface of the ceramic body.

3. The composite electronic component of claim 1, wherein the first and second electrodes face each other on the same plane.

4. The composite electronic component of claim 1, wherein the discharging part includes a conductive polymer.

5. The composite electronic component of claim 1, wherein the protective layer includes an epoxy based resin.

6. A board for mounting of a composite electronic component, comprising:
   a printed circuit board on which a plurality of electrode pads are disposed;
   the composite electronic component of claim 1 installed on the printed circuit board; and
   a solder connecting the electrode pads and the composite electronic component to each other.

7. A packaging unit of a composite electronic component, comprising:
   the composite electronic component of claim 1; and
   a packaging sheet having a receiving part, the receiving parts receiving the composite electronic component, wherein the internal electrodes are disposed horizontally based on bottom surfaces of the receiving part and are aligned with each other.

8. The packaging unit of a composite electronic component of claim 7, wherein the respective composite electronic component received in the receiving part is disposed so that the ESD protection device is directed toward the bottom surface of the receiving part.

9. The packaging unit of a composite electronic component of claim 7, further comprising a packaging film coupled to the packaging sheet and covering the composite electronic components.

10. The packaging unit of a composite electronic component of claim 7, wherein the packaging sheet in which the composite electronic components are received is coiled in a coil shape.

11. A composite electronic component comprising:
    a composite body including a capacitor and an ESD protection device coupled to each other, the capacitor including a ceramic body in which a plurality of dielectric layers and a plurality of first and second internal electrodes are stacked with a respective dielectric layer interposed between the first and second internal electrodes, and the ESD protection device including a substrate, first and second electrodes disposed below the substrate and insulated from each other, a discharging part disposed between the first and second electrodes, and a protective layer disposed below the first and second electrodes and the discharging part to substantially cover the entirety of upper surfaces of the first and second electrodes and the discharging part;
    a first external electrode disposed to cover an entirety of a first end surface of the ceramic body in a length direction of the ceramic body and connected to the first internal electrodes of the capacitor and a second external electrode disposed to cover an entirety of a second end surface of the ceramic body in the length direction and connected to the second internal electrodes of the capacitor; and
    a third external electrode disposed on a first end surface of the ESD protection device in the length direction, partially disposed on a surface of the protective layer in a thickness direction, and connected to the first electrode and a fourth external electrode disposed on a second end surface of the ESD protection device in the length direction, partially disposed on a surface of the protective layer in a thickness direction, and connected to the second electrode,
    wherein the composite body includes an input terminal including the first and third external electrodes coupled to each other and a ground terminal including the second and fourth external electrodes coupled to each other, the capacitor and the ESD protection device are coupled to each other by a conductive adhesive, and plating layers are disposed on outer portions of the input terminal and the ground terminal,
    wherein the protective layer, in the length direction, ends at a respective end surface of the ceramic body.

12. The composite electronic component of claim 11, wherein the ESD protection device is disposed on a lower surface of the capacitor.

13. The composite electronic component of claim 11, wherein the first and second electrodes face each other on the same plane.

14. The composite electronic component of claim 11, wherein the discharging part includes a conductive polymer.

15. The composite electronic component of claim 11, wherein the protective layer includes an epoxy based resin.

16. A board for mounting of a composite electronic component, comprising:
- a printed circuit board on which a plurality of electrode pads are disposed;
- the composite electronic component of claim 11 installed on the printed circuit board; and
- a solder connecting the electrode pads and the composite electronic component to each other.

17. A packaging unit of a composite electronic component, comprising:
- the composite electronic component of claim 11; and
- a packaging sheet having a receiving part, the receiving parts receiving the composite electronic component,
- wherein the internal electrodes are disposed horizontally based on bottom surfaces of the receiving part and are aligned with each other.

18. The packaging unit of a composite electronic component of claim 17, wherein the respective composite electronic component received in the receiving part is disposed so that the ESD protection device is directed toward the bottom surface of the receiving part.

19. The packaging unit of a composite electronic component of claim 17, further comprising a packaging film coupled to the packaging sheet and covering the composite electronic components.

20. The packaging unit of a composite electronic component of claim 17, wherein the packaging sheet in which the composite electronic components are received is coiled in a coil shape.

21. A composite electronic component comprising:
- a composite body in which a noise filter unit and an ESD protection device disposed below the noise filter unit are coupled to each other, the ESD protection device having first and second electrodes; and
- an input terminal and a ground terminal coupled to the composite body and each partially disposed on a surface of the ESD protection device in a thickness direction,
- wherein the noise filter unit is configured to filter a noise component of an input signal input to the input terminal, and the ESD protection device bypasses an overvoltage input beyond a rated voltage applied to the input terminal;
- wherein the ESD protection device includes a discharging part disposed between the first and second electrodes, and a protective layer disposed on the first and second electrodes and the discharging part,
- wherein the protective layer, in a length direction, ends at a respective end surface of the composite body, and
- wherein the input terminal covers an entirety of a first end surface in the length direction and the ground terminal covers an entirety of a second end surface in the length direction.

22. The composite electronic component of claim 21, wherein the protective layer is disposed to substantially cover the entirety of upper surfaces of the first and second electrodes and the discharging part.

23. The composite electronic component of claim 22, wherein the ESD protection device bypasses the overvoltage input applied to the input terminal by enabling the discharging part to be in a conductive state.

24. The composite electronic component of claim 22, wherein the first and second electrodes face each other on the same plane.

25. The composite electronic component of claim 22, wherein the discharging part includes a conductive polymer.

26. The composite electronic component of claim 22, wherein the protective layer includes an epoxy based resin.

27. The composite electronic component of claim 21, wherein the ESD protection device is an ESD suppressor.

28. A board for mounting of a composite electronic component, comprising:
- a printed circuit board on which a plurality of electrode pads are disposed;
- the composite electronic component of claim 21 installed on the printed circuit board; and
- a solder connecting the electrode pads and the composite electronic component to each other.

29. A method of manufacturing a composite electronic component, comprising:
- preparing a capacitor including a ceramic body in which a plurality of dielectric layers and internal electrodes are stacked with a respective dielectric layer interposed between the internal electrodes;
- forming first and second electrodes on the ceramic body so as to be insulated from each other;
- applying a paste containing a conductive polymer between the first and second electrodes to prepare a discharging part;
- applying an insulating resin onto the first and second electrodes and the discharging part to prepare an ESD protection device; and
- forming an input terminal and a ground terminal each covering an entirety of corresponding end surfaces of a composite body in a length direction of the composite body, respectively, and partially disposed on a surface of the insulating resin in a thickness direction, the composite body being formed by coupling to each other the capacitor including the ceramic body and the ESD protection device formed on the ceramic body;
- wherein the discharging part is formed such that it is between the first and second electrodes, and the insulating resin is applied onto the first and second electrodes and the discharging part to substantially cover the entirety of upper surfaces of the first and second electrodes and the discharging part,
- wherein the insulating resin ends at a respective end surface of the ceramic body in the length direction.

30. The method of manufacturing a composite electronic component of claim 29, wherein the forming of the first and second electrodes is performed by a printing method.

31. The method of manufacturing a composite electronic component of claim 29, wherein the applying of the paste containing the conductive polymer between the first and second electrodes is performed by a printing method.

32. The method of manufacturing a composite electronic component of claim 29, wherein the insulating resin is an epoxy based resin.

33. A composite electronic component comprising:
- a capacitor having a body in which are located internal electrodes separated by dielectric material;
- an electrostatic discharge (ESD) protection device disposed on the body of the capacitor and having first and second electrodes coupled to the internal electrodes of the capacitor, the ESD having a discharge part between first and second electrodes at opposite portions of the discharge part, and a protective layer disposed below the first and second electrodes and the discharging part to substantially cover the entirety of upper surfaces of the first and second electrodes and the discharging part; and input and ground terminals coupled to the first and second electrodes of the ESD and partially disposed on a surface of the ESD in a thickness direction, wherein the protective layer, in a length direction, ends at a respective end surface of the ceramic body, and wherein the input terminal covers an entirety of a first end surface in the length direction and the ground terminal covers an entirety of a second end surface in the length direction.

34. The composite electronic component of claim 33, wherein the capacitor has a ceramic body on which the ESD is disposed.

35. The composite electronic component of claim 34, wherein the first and second electrodes of the ESD are disposed on the ceramic body.

36. The composite electronic component of claim 35, including a protective layer disposed on the first and second electrodes and the discharging part of the ESD.

37. The composite electronic component of claim 36, in which the capacitor comprises a plurality of dielectric layers, and internal electrodes are stacked with respective dielectric layers interposed between internal electrodes.

* * * * *